United States Patent
Kanayama

(10) Patent No.: US 8,368,573 B2
(45) Date of Patent: Feb. 5, 2013

(54) ANALOG-TO-DIGITAL CONVERTER AND DIGITAL-TO-ANALOG CONVERTER

(75) Inventor: Yasutaka Kanayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 170 days.

(21) Appl. No.: 12/984,848

(22) Filed: Jan. 5, 2011

(65) Prior Publication Data

US 2011/0169675 A1    Jul. 14, 2011

(30) Foreign Application Priority Data

Jan. 8, 2010    (JP) .................................. 2010-003280

(51) Int. Cl.
*H03M 3/00*    (2006.01)

(52) U.S. Cl. .......................... 341/143; 341/155; 341/144

(58) Field of Classification Search .................. 341/155, 341/143, 156, 144
See application file for complete search history.

(56) References Cited

U.S. PATENT DOCUMENTS

| | | | |
|---|---|---|---|
| 5,408,235 A | | 4/1995 | Doyle et al. |
| 5,646,621 A | * | 7/1997 | Cabler et al. .................. 341/143 |
| 5,796,360 A | * | 8/1998 | Wendelrup ..................... 341/143 |
| 6,111,531 A | * | 8/2000 | Farag ............................ 341/143 |
| 6,304,608 B1 | | 10/2001 | Chen et al. |
| 6,426,714 B1 | * | 7/2002 | Ruha et al. ..................... 341/143 |
| 6,452,525 B1 | * | 9/2002 | Nguyen ........................ 341/143 |
| 6,535,153 B1 | * | 3/2003 | Zierhofer ...................... 341/143 |

FOREIGN PATENT DOCUMENTS

| | | |
|---|---|---|
| JP | 03-101411 A | 4/1991 |
| JP | 5-327512 A | 12/1993 |
| JP | 06-232857 A | 8/1994 |

OTHER PUBLICATIONS

Extended European Search Report, dated Mar. 30, 2011 for corresponding European Application No. 10195603.5.
Fogleman et al., "A 3.3-V Single-Poly CMOS Audio ADC Delta-Sigma Modulator with 98-dB Peak SINAD and 105-dB Peak SFDR", IEEE Journal of Solid-State Circuits, IEEE Service Center, Piscataway, NJ, USA, vol. 35, No. 3, XP011061198, ISSN: 0018-9200, pp. 297-307.
"Japanese Official Action", mailed by JPO and corresponding to Japanese application No. 2010-003280 on Jul. 26, 2011, with partial English translation.

* cited by examiner

*Primary Examiner* — Jean B Jeanglaude
(74) *Attorney, Agent, or Firm* — Fujitsu Patent Center

(57) ABSTRACT

An A/D converter includes an adjusting circuit to adjust a total of an amount of change of $\Sigma\Delta$ modulated data output from a $\Sigma\Delta$ modulator and an amount of change of dummy data to be constant, and a level converting part supplied with the $\Sigma\Delta$ modulated data. The level converting part includes a first level converter to output the $\Sigma\Delta$ modulated data by converting a level of the $\Sigma\Delta$ modulated data, and a second level converter to receive the dummy data from the adjusting circuit and interpolate dummy noise, in order to cancel a frequency dependence of noise with respect to the $\Sigma\Delta$ modulated data.

11 Claims, 23 Drawing Sheets

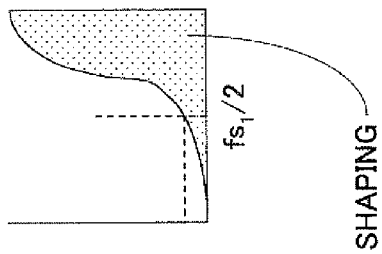
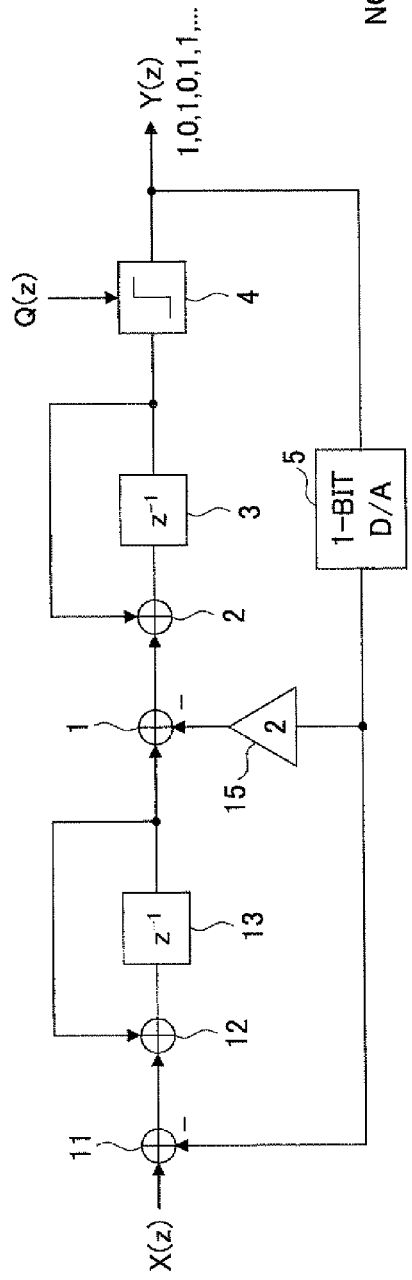

FIG.7C

ΣΔ MODULATED DATA: 0,1,1,0,1,0,0,1,0,1,1,1,1,0,0

AMOUNT OF POWER SUPPLY NOISE: 1,0,1,1,1,0,1,1,1,0,0,0,1,0 (FREQUENCY COMPONENT DIFFERENT FROM ΣΔ MODULATED DATA)
(RELATIVE VALUE)

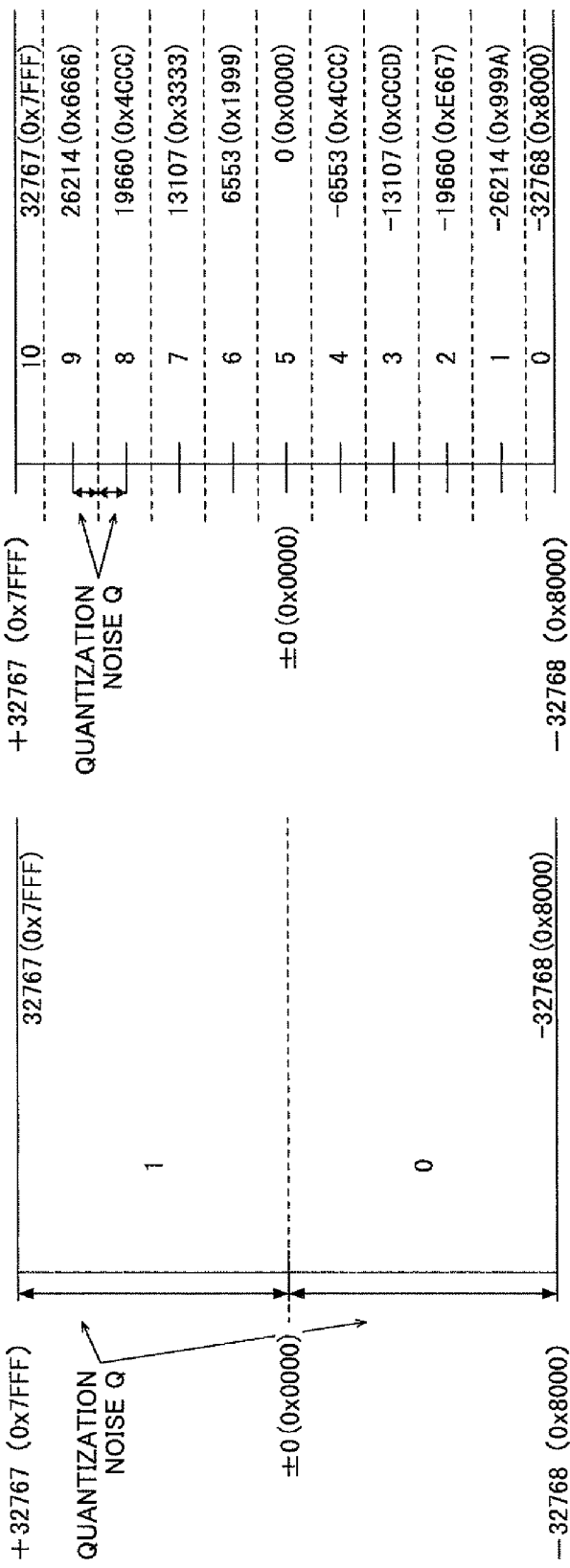

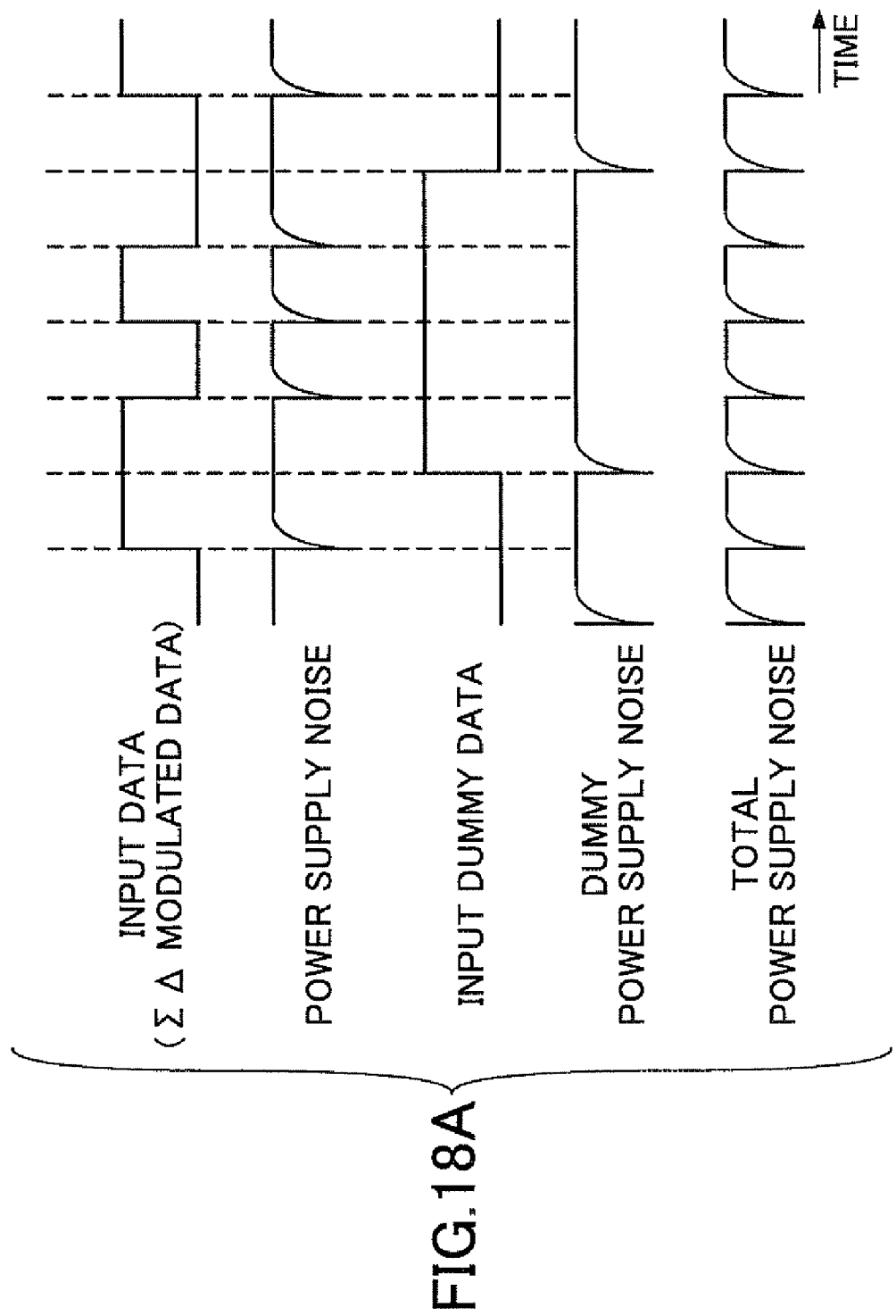

FIG.18C

ΣΔ MODULATED DATA: 0, 1, 1, 0, 1, 0, 0, 1, 0, 1, 1, 1, 1, 0, 0

AMOUNT OF POWER SUPPLY NOISE: 1, 0, 1, 1, 1, 0, 1, 1, 1, 0, 0, 0, 1, 0

DUMMY DATA: 0, 0, 1, 1, 1, 0, 0, 0, 0, 1, 0, 1, 1, 0

AMOUNT OF POWER SUPPLY NOISE: 0, 1, 0, 0, 0, 1, 0, 0, 0, 1, 1, 1, 0, 1

TOTAL AMOUNT OF POWER SUPPLY NOISE: 1, 1, 1, 1, 1, 1, 1, 1, 1, 1, 1, 1, 1, 1

ANALOG-TO-DIGITAL CONVERTER AND DIGITAL-TO-ANALOG CONVERTER

CROSS-REFERENCE TO RELATED APPLICATIONS

This application is based upon and claims the benefit of priority of the prior Japanese Patent Application No. 2010-003280, filed on Jan. 8, 2010, the entire contents of which are incorporated herein by reference.

FIELD

Embodiments discussed herein are related to Analog-to-Digital (A/D) converters and Digital-to-Analog (D/A) converters.

BACKGROUND

A sigma-delta ($\Sigma\Delta$) modulation A/D converter may improve the bit accuracy of the pass-band due to the effects of oversampling and noise shaping.

The oversampling refers to the sampling of an analog signal at a high sampling rate that is a multiple of several tens to several hundreds the sampling rate necessary for the pass-band. FIGS. 1A and 1B are diagrams for explaining scattering of quantization noise by oversampling. In FIGS. 1A and 1B, the ordinate indicates the noise level in arbitrary units, and the abscissa indicates the sampling frequency in arbitrary units. Further, $fs_1$ denotes the sampling frequency before the oversampling, and $fs_2$ denotes the sampling frequency after the oversampling. The noise illustrated in FIG. 1A may be scattered by the oversampling such that the quantization noise having a total amount that is constant is scattered in the wider frequency band illustrated in FIG. 1B, in order to obtain the effect of reducing the amount of noise included in the pass-band.

The noise shaping refers to the shaping and shifting of the quantization noise having a flat distribution into the high-frequency range. The $\Sigma\Delta$ modulator performs the noise shaping using a feedback circuit, but the noise shaping characteristic or the sharpness of the noise waveform after the noise shaping may be varied by the circuit structure thereof.

FIGS. 2A and 2B are diagrams for explaining an example of a first order $\Sigma\Delta$ modulation A/D converter that is used in a $\Sigma\Delta$ modulation A/D converter. FIG. 2A illustrates the structure of the first order $\Sigma\Delta$ modulator, and FIG. 2B illustrates a noise waveform after noise shaping by the first order $\Sigma\Delta$ modulator. In FIG. 2B, the ordinate indicates the noise level in arbitrary units, and the abscissa indicates the sampling frequency in arbitrary units. The first order $\Sigma\Delta$ modulator includes adders 1 and 2, an integrator 3, a comparator 4, and a 1-bit D/A converter 5 that are connected as illustrated in FIG. 2A. A digital output data Y(z) of the first order $\Sigma\Delta$ modulator with respect to an analog input data X(z) may be represented by $Y(z) = z^{-1} X(z) + (1-z^{-1}) Q(z)$, and the value of the noise shaping of the noise waveform corresponds to the term $(1-z^{-1}) Q(z)$, where Q(z) denotes the quantization noise.

FIGS. 3A and 3B are diagrams for explaining an example of a second order $\Sigma\Delta$ modulation A/D converter that is used in the $\Sigma\Delta$ modulation A/D converter. FIG. 3A illustrates the structure of the second order $\Sigma\Delta$ modulator, and FIG. 3B illustrates a noise waveform after noise shaping by the second order $\Sigma\Delta$ modulator. In FIG. 3B, the ordinate indicates the noise level in arbitrary units, and the abscissa indicates the sampling frequency in arbitrary units. The second order $\Sigma\Delta$ modulator includes adders 1, 2, 11 and 12, integrators 3 and 13, a comparator 4, a 1-bit D/A converter 5, and a multiplier 15 that are connected as illustrated in FIG. 3A. A digital output data Y(z) of the second order $\Sigma\Delta$ modulator with respect to an analog input data X(z) may be represented by $Y(z) = z^{-2} X(z) + (1-z^{-1})^2 Q(z)$, and the value of the noise shaping of the noise waveform corresponds to the term $(1-z^{-1})^2 Q(z)$, where Q(z) denotes the quantization noise.

The $\Sigma\Delta$ modulation A/D converter may have a structure including the $\Sigma\Delta$ modulator illustrated in FIG. 2 or FIG. 3, a digital lowpass filter (not illustrated), and a decimator (not illustrated), for example. In this case, the digital lowpass filter eliminates the quantization noise that is shifted in the high-frequency range by the $\Sigma\Delta$ modulator. The decimator decimates the output data of the digital lowpass filter, that has been eliminated of the quantization noise, in order to convert the analog data input to the $\Sigma\Delta$ modulator into high-precision digital data.

The $\Sigma\Delta$ modulator is also applicable to a $\Sigma\Delta$ modulation D/A converter. FIG. 4 are diagrams for explaining an example of a second order $\Sigma\Delta$ modulation A/D converter that is used in the $\Sigma\Delta$ modulation D/A converter. FIG. 4A illustrates digital data input to the $\Sigma\Delta$ modulator, and FIG. 4B illustrates the structure of the $\Sigma\Delta$ modulator. The $\Sigma\Delta$ modulator includes adders 21, 22, 31 and 32, integrators 2 and 33, a comparator 24, a 16-bit A/D converter 25, and a multiplier 35 that are connected as illustrated in FIG. 4B. Q(z) denotes the quantization noise.

The digital data is input to the $\Sigma\Delta$ modulator, and the analog data is output from the $\Sigma\Delta$ modulator. The $\Sigma\Delta$ modulation D/A converter may have a structure including the $\Sigma\Delta$ modulator illustrated in FIG. 4B, an interpolator (not illustrated), and a D/A conversion and lowpass filter part (not illustrated), for example. In this case, the digital data input to the $\Sigma\Delta$ modulator is oversampled at a high rate by an interpolation performed by the interpolator. For example, the 16-bit digital data is converted into data of 1 bit or several bits by the digital processing of the $\Sigma\Delta$ modulator, in order to form a $\Sigma\Delta$ modulation D/A converter that is uneasily affected by inconsistencies in the characteristics of analog elements. In addition, the high-frequency noise within the digital data may easily be eliminated by the D/A conversion and lowpass filter part.

The $\Sigma\Delta$ modulation A/D converter and the $\Sigma\Delta$ modulation D/A converter using the $\Sigma\Delta$ modulator described above may be utilized in various fields including audio equipments and measuring equipments, where high-precision A/D conversion or high-precision D/A conversion is required.

FIG. 5 is a diagram for explaining an example of the $\Sigma\Delta$ modulation A/D converter using the $\Sigma\Delta$ modulator. The $\Sigma\Delta$ modulation A/D converter includes an analog part 41 and a digital part 42. The analog part 41 includes a $\Sigma\Delta$ modulator 411, a Delay Flip-Flip (D-FF) 412, and a level converting part 413 including level converters 4131 and 4132, which are connected as illustrated in FIG. 5. The level converter 4131 is provided with respect to a clock signal, and the level converter 4132 is provided with respect to $\Sigma\Delta$ modulated data. The digital part 42 includes a lowpass filter 421, and a decimator 422 which are connected as illustrated in FIG. 5. For example, a power supply voltage Va=5.0V is supplied to the analog part 41, and a power supply voltage Vd=1.8 V is supplied to the digital part 42. In FIG. 5, GNDa denotes the ground for the analog part 41, and GNDd denotes the ground for the digital part 42. The level converting part 412 receives both the power supply voltage Va and the power supply voltage Vd.

FIG. 6 is a diagram for explaining an example of the $\Sigma\Delta$ modulation D/A converter using the $\Sigma\Delta$ modulator. The $\Sigma\Delta$ modulation D/A converter includes a digital part 51 and an analog part 52. The digital part 51 includes an interpolator 511, a ΣΔ modulator 512, and a D-FF 513 which are connected as illustrated in FIG. 6. In addition, the analog part 52 includes a level converting part 521, a D-FF 522, and a D/A conversion and lowpass filter part 523 which are connected as illustrated in FIG. 6. The level converting part 521 includes a level converter provided with respect to the clock signal, and a level converter provided with respect to the ΣΔ modulated data, similarly to the level converting part 413 illustrated in FIG. 5. For example, the power supply voltage Vd=1.8 V is supplied to the digital part 51, and the power supply voltage Va=5.0 V is supplied to the analog part 52. GNDd denotes the ground for the digital part 51, and GNDa denotes the ground for the analog part 52. The level converting part 521 receives both the power supply voltage Va and the power supply voltage Vd.

In the circuits illustrated in FIGS. 5 and 6 in which the analog part and the digital part coexist, the ground GNDa for the analog part and the ground GNDd for the digital part may be provided separately for the purposes of reducing the noise or reducing the power consumption. In this case, a level converting part is provided at an interface, and a delay circuit, such as a D-FF, is provided for clock signal synchronization. However, in the level converting part and the D-FF, a relatively large current may flow for an instant at a data transition point where the input data value makes a transition from "0" to "1" or makes a transition from "1" to "0", and the relatively large current may cause power supply noise of the power supply or the ground.

FIGS. 7A, 7B, and 7C are diagrams for explaining an example of the power supply noise generated at the data transition point. FIG. 7A illustrates the input data to the level converting part (413 or 521), and the power supply noise with respect to the analog part (41 or 52). FIG. 7B illustrates the input clock signal and the input data with respect to the D-FF (412 or 513), and the power supply noise with respect to the analog part (41 or 52). In FIGS. 7A and 7B, the ordinate indicates the signal level in arbitrary units, and the abscissa indicates the time in arbitrary units. In addition, FIG. 7C illustrates the ΣΔ modulated data output from the ΣΔ modulator (411 or 512), and a relative value of the amount of power supply noise with respect to the analog part (41 or 52).

The power supply noise with respect to the analog part includes a frequency component different from that of the ΣΔ modulated data, but as may be seen from FIGS. 8 through 10, the power supply noise component is dependent on the input data frequency or the clock signal frequency. FIG. 8 is a diagram illustrating an example of a ΣΔ modulated data spectrum for a case where the input data frequency is 1020 Hz, with the ordinate indicating the signal level and the abscissa indicating the frequency. FIG. 9 is a diagram illustrating an example of a power supply noise spectrum for the case where the input data frequency is 1020 Hz, with the ordinate indicating the relative value of the noise level and the abscissa indicating the frequency. FIG. 10 is a diagram illustrating an example of an output signal spectrum affected by power supply noise for the case where the input data frequency is 1020 Hz, with the ordinate indicating the signal level and the abscissa indicating the frequency. In FIG. 8 and the like, a 32 k-mode signal is subjected to a 64-times oversampling, for example, and the oversampling frequency is 2.048 MHz.

In the ΣΔ modulation A/D converter, the power supply noise may generate an error in the sampling value of the input analog data. In this case, the ΣΔ modulated data may include the power supply noise component.

On the other hand, in the ΣΔ modulation D/A converter, the power supply noise may mix into the output analog data. In this case, if the ΣΔ modulation D/A converter is used in an audio equipment, for example, the power supply noise that mixes into the output analog data may be heard as non-negligible noise.

Recently, a method has been proposed to output a multi-valued output having three or more values from the comparator of the ΣΔ modulator, instead of a binary output that is "0" or "1", particularly for use in the ΣΔ modulation D/A converter. When the multi-valued output having three or more values is output from the comparator, it is possible to reduce the noise component corresponding to the term $(1-z^{-1})Q(z)$ in FIGS. 2A and 2B. FIGS. 11A and 11B are diagrams for explaining quantization noise for a case where the comparator output is the binary output and a 11-valued output, with the amount of noise indicated in arbitrary units. FIG. 11A illustrates the quantization noise Q for the case where the binary output is output from the comparator, and FIG. 11B illustrates the quantization noise Q for the case where the 11-valued output is output from the comparator. As may be seen from a comparison of FIGS. 11A and 11B, the amount of the quantization noise Q for the 11-valued output of the comparator is smaller than the amount of the quantization noise Q for the binary output of the comparator.

However, the inconsistencies in the characteristics of the analog elements, which do not greatly affect the ΣΔ modulation D/A converter when the comparator outputs the binary output, may cause non-negligible effects when the comparator outputs the multi-valued output having three or more values. For this reason, it may be desirable to average the inconsistencies in the characteristics of the analog elements by employing a technique such as the Dynamic Element Matching (DEM). In one example of the DEM, the analog element that is used is shifted one analog element at a time, as illustrated in FIG. 12A. FIGS. 12A and 12B are diagrams for explaining an example of the DEM. FIG. 12A illustrates the ΣΔ modulated data, and FIG. 12B illustrates the power supply noise. In FIGS. 12A and 12B, it is assumed for the sake of convenience that the ΣΔ modulated data includes 10 bits DT01 through DT10, and the value of the ΣΔ modulated data changes as MD1→MD2→MD3→MD4, that is, changes as 4→5→5→4.

When the value of the ΣΔ modulated data changes as MD1→MD2, a number of logic inversions (or the amount of data change) becomes "3" as indicated by hatching in FIG. 12A. When the ΣΔ modulation changes as MD2→MD3, the number of logic inversions becomes "2" as indicated by the hatching in FIG. 12A. In addition, when the value of the ΣΔ modulated data changes from MD3→MD4, the number of logic inversions becomes "1", as indicated by the hatching in FIG. 12A. FIG. 12B illustrates the power supply noise for the case where the number of logic inversions is "3", "2", and "1". In FIG. 12B, the ordinate indicates the noise level in arbitrary units, and the abscissa indicates the time in arbitrary units.

When the multi-valued output of the comparator has three or more values, the number of level converting parts, the number of the D-FFs and the like that are used become larger than those used in the case where the comparator outputs the binary output. Consequently, the circuit scale increases even when the DEM or the like is employed, and the power supply noise tends to increase with the increase in the circuit scale for the case where the comparator outputs the multi-valued output having three or more values. The power supply noise component for the case where the comparator outputs the multi-valued output having three or more values is dependent on the input data frequency or the clock signal frequency, similarly to the case where the comparator outputs the binary output, as may be seen from FIGS. 13 through 15 which illustrate the case where the comparator outputs the 11-valued output. FIG. 13 is a diagram illustrating an example of a ΣΔ modulated data spectrum for the case where the input data frequency is 1020 Hz, with the ordinate indicating the signal level and the abscissa indicating the frequency. FIG. 14 is a diagram illustrating an example of a power supply noise spectrum for the case where the input data frequency is 1020 Hz, with the ordinate indicating the relative value of the noise level and the abscissa indicating the frequency. In addition, FIG. 15 is a diagram illustrating an example of an output signal spectrum affected by the power supply noise for the case where the input data frequency is 1020 Hz, with the ordinate indicating the signal level and the abscissa indicating the frequency.

Japanese Laid-Open Patent Publications No. 6-232857 and No. 3-101411 disclose the ΣΔ modulation A/D and/or D/A converter.

According to the above-described A/D converters and D/A converters, it is difficult to reduce the noise.

SUMMARY

According to an embodiment of the invention, an analog-to-digital converter includes a ΣΔ modulator; an adjusting circuit, responsive to an input analog data, configured to adjust a total of an amount of change of ΣΔ modulated data output from the ΣΔ modulator and an amount of change of dummy data to be constant; and a level converting part configured to receive the ΣΔ modulated data. The level converting part includes a first level converter configured to output the ΣΔ modulated data by converting a level of the ΣΔ modulated data, and a second level converter configured to receive the dummy data from the adjusting circuit and to interpolate dummy noise. The second level converter is configured to cancel a frequency dependence of noise with respect to the ΣΔ modulated data.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 3A and 3B are diagrams for explaining an example of a second order ΣΔ modulation A/D converter that is used in the ΣΔ modulation A/D converter;

FIGS. 7A, 7B, and 7C are diagrams for explaining an example of power supply noise generated at a data transition point;

FIGS. 11A and 11B are diagrams for explaining quantization noise for a case where a comparator output is a binary output and a 11-valued output;

FIGS. 18A, 18B, and 18C are diagrams for explaining an example of power supply noise generated at a data transition point;

DESCRIPTION OF EMBODIMENTS

Hereinafter, Analog-to-Digital (A/D) converters and Digital-to-Analog (D/A) converters according to the embodiments of the present invention will be described with reference to the accompanying drawings.

According to one aspect of the present invention, the A/D converter includes an adjusting circuit and a level converting part. The adjusting circuit adjusts a total of an amount of change of ΣΔ modulated data output from a ΣΔ modulator which receives analog data, and an amount of change of dummy data, to become constant. The level converting part includes a first level converter that outputs the ΣΔ modulated data by converting the level of the ΣΔ modulated data, and a second level converter that receives the dummy data from the adjusting circuit and interpolates the dummy noise, in order to cancel the frequency dependence of the noise with respect to the ΣΔ modulated data by the second level converter.

According to one aspect of the present invention, the D/A converter includes an adjusting circuit and a level converting part. The adjusting circuit adjusts a total of an amount of change of ΣΔ modulated data output from a ΣΔ modulator which receives digital data, and an amount of change of dummy data, to become constant. The level converting part includes a first level converter that outputs the ΣΔ modulated data by converting the level of the ΣΔ modulated data, and a second level converter that receives the dummy data from the adjusting circuit and interpolates the dummy noise, in order to cancel the frequency dependence of the noise with respect to the ΣΔ modulated data by the second level converter.

The frequency dependence of the noise with respect to the ΣΔ modulated data may be cancelled by providing a dummy digital element, such as the level converter that interpolates the dummy noise dependent on the input data frequency or the clock signal frequency.

A description will now be given of the A/D converter and the D/A converter in each embodiment according to the present invention.

First Embodiment

Figure 1B:
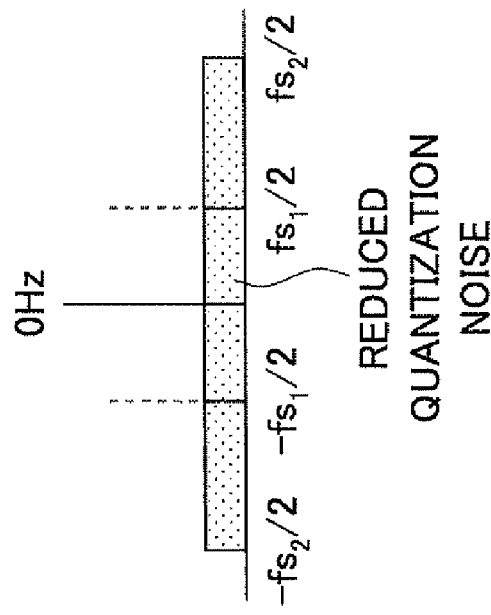
FIGS. 1A and 1B are diagrams for explaining scattering of quantization noise by the oversampling.
Figure 1A:
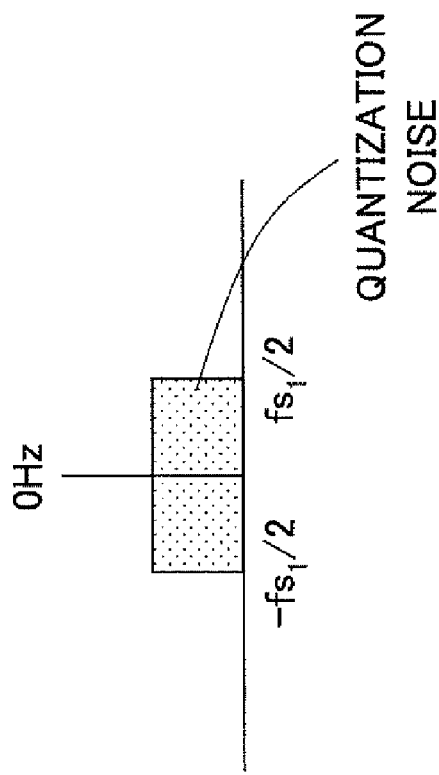
Figure 2B:
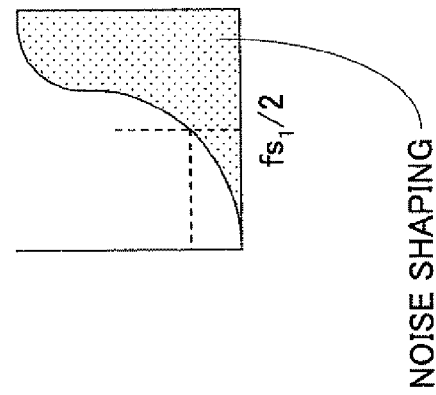
FIGS. 2A and 2B are diagrams for explaining an example of a first order ΣΔ modulation A/D converter that is used in a ΣΔ modulation A/D converter.
Figure 2A:
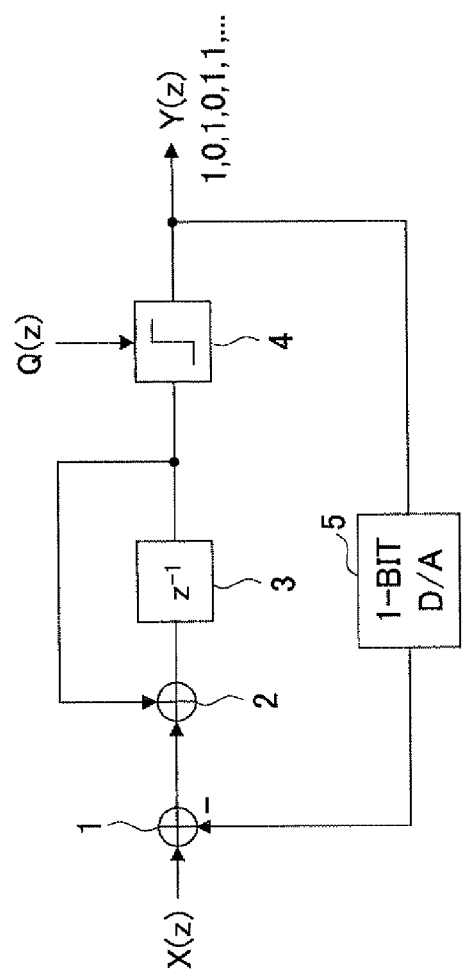
Figure 4A:
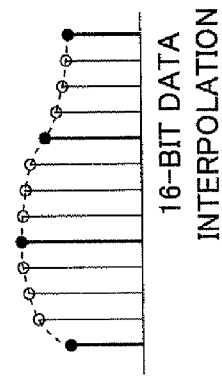
FIGS. 4A and 4B are diagrams for explaining an example of a second order ΣΔ modulation A/D converter that is used in a ΣΔ modulation D/A converter.
Figure 4B:
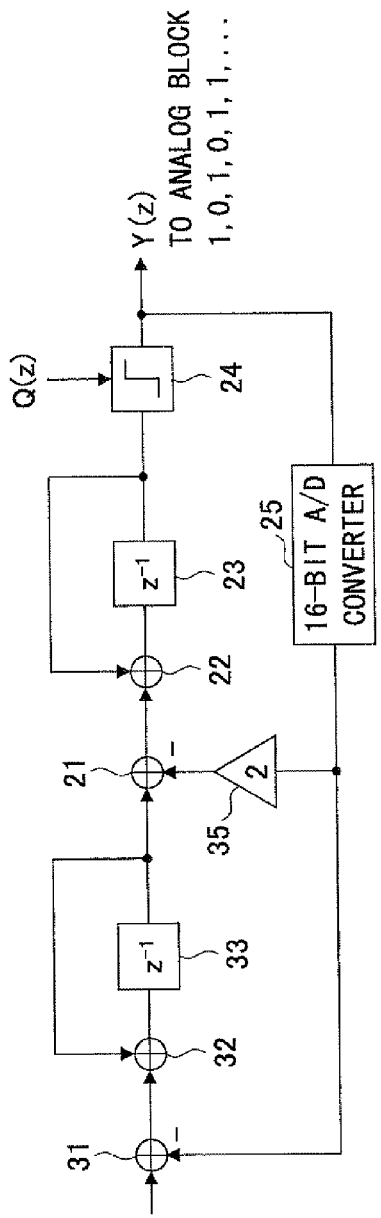
Figure 5:
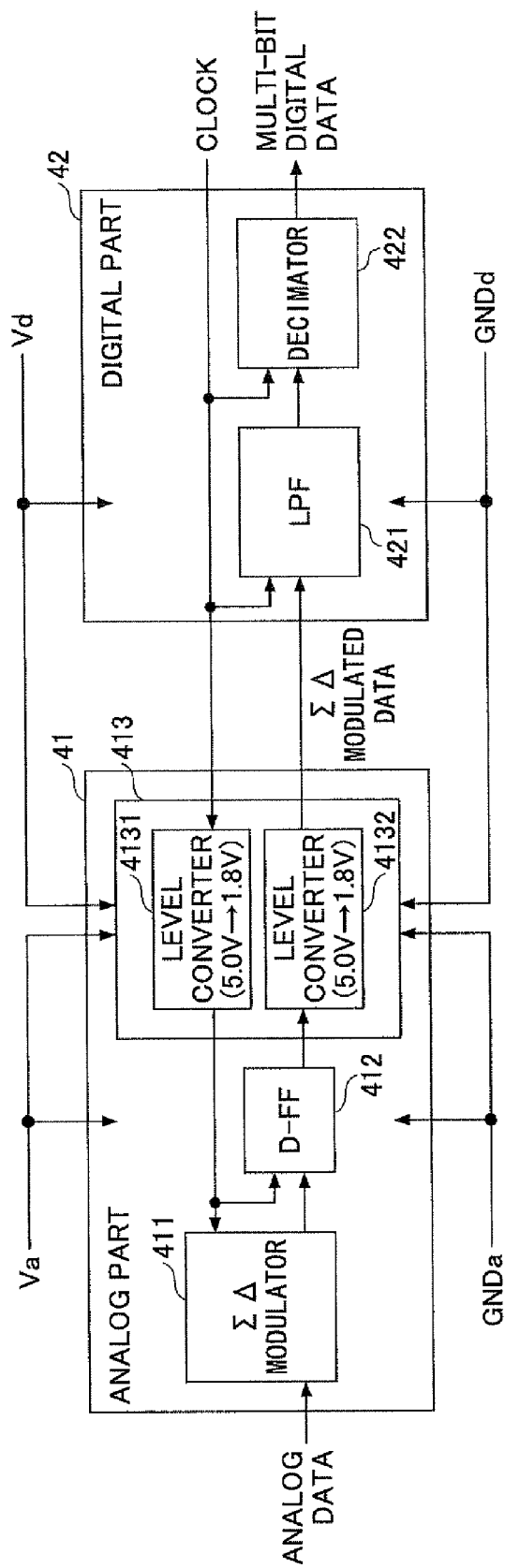
FIG. 5 is a diagram for explaining an example of the ΣΔ modulation A/D converter using the ΣΔ modulator.
Figure 16:
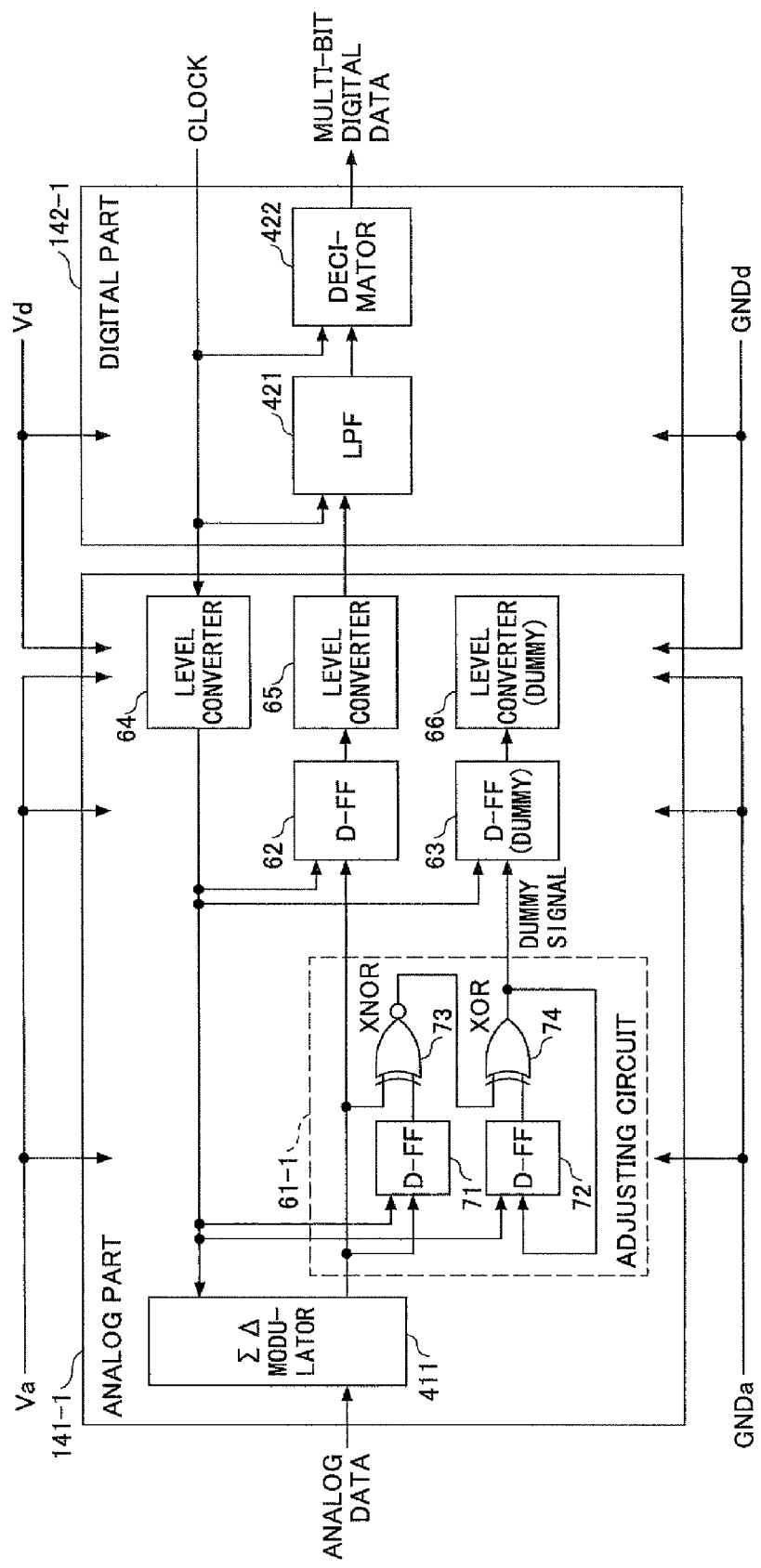
FIG. 16 is a diagram for explaining an A/D converter in a first embodiment of the present invention.

FIG. 16 is a diagram for explaining the A/D converter in a first embodiment of the present invention. In FIG. 16, those parts that are the same as those corresponding parts in FIG. 5 are designated by the same reference numerals, and a description thereof will be omitted.

FIG. 16 illustrates a ΣΔ modulation A/D converter using a ΣΔ modulator. The ΣΔ modulation A/D converter includes an analog part 141-1 and a digital part 142-1. The analog part 141-1 includes a ΣΔ modulator 411, an adjusting circuit 61-1 configured to maintain power supply noise constant, Delay Flip-Flops (D-FFs) 62 and 63, and level converters 64, 65 and 66 that are connected as illustrated in FIG. 16. The level converters 64, 65 and 66 form a level converting part. The D-FF 62 corresponds to the D-FF 412 illustrated in FIG. 5, and the level converters 64 and 65 correspond to the level converters 4131 and 4132 illustrated in FIG. 5. The D-FF 63 forms a dummy D-FF provided with respect to the D-FF 62, and the level converter 66 forms a dummy level converter provided with respect to the level converter 65.

On the other hand, the digital part 142-1 includes a lowpass filter 421 and a decimator 422 that are connected as illustrated in FIG. 16. For example, a power supply voltage Va=5.0 V is supplied to the analog part 141-1, and a power supply voltage Vd=1.8 V is supplied to the digital part 142-1. GNDa denotes the ground for the analog part 141-1, and GNDd denotes the ground for the digital part 142-1.

The adjusting circuit 61-1 includes D-FFs 71 and 72, an exclusive-NOR (XNOR) circuit 73, and an exclusive-OR (XOR) circuit 74 that are connected as illustrated in FIG. 16. The XOR circuit 74 outputs the dummy data (or dummy signal), as will be described later. The XNOR circuit 73 obtains an exclusive-NOR between the present (or current) ΣΔ modulated data and the ΣΔ modulated data of one clock before in order to observe the amount of change of the ΣΔ modulated data from the ΣΔ modulator 411. The output data of the XNOR circuit 73 is supplied to one input of the XOR circuit 74. The output data of the XNOR circuit 73 has a data value "1" if two successive ΣΔ modulated data have the same data value "0" or "1" (that is, the data value does not change), and has a data value "0" if the two successive ΣΔ modulated data make a transition from "0" to "1" or from "1" to "0" (that is, the data value changes). The XOR circuit 74 obtains an exclusive-OR between the output data of the XNOR circuit 73 and the output dummy data of the XOR circuit 74 of one clock before. The present (or current) output dummy data of the XOR circuit 74 is supplied to the D-FF 63.

An inverted value of the dummy data of one clock before becomes the present output data if the ΣΔ modulated data does not change (that is, makes no transition). On the other hand, the dummy data of one clock before becomes the present output data if the ΣΔ modulated data changes (that is, makes a transition). For this reason, the adjusting circuit 61-1 may carry out a control so that a sum of the amount of change of the ΣΔ modulated data and the amount of change of the dummy data becomes "1", in order to maintain the power supply noise constant. In addition, even in the case where the ΣΔ modulator outputs the multi-valued output having three or more values, the power supply noise may be maintained constant by providing the structure described above in multiple. In other words, the frequency dependence of the power supply noise with respect to the ΣΔ modulated data may be cancelled by providing the dummy digital elements, such as the D-FF and the level converter, which interpolate dummy power supply noise dependent on the input data frequency or the clock signal frequency.

Figure 6:
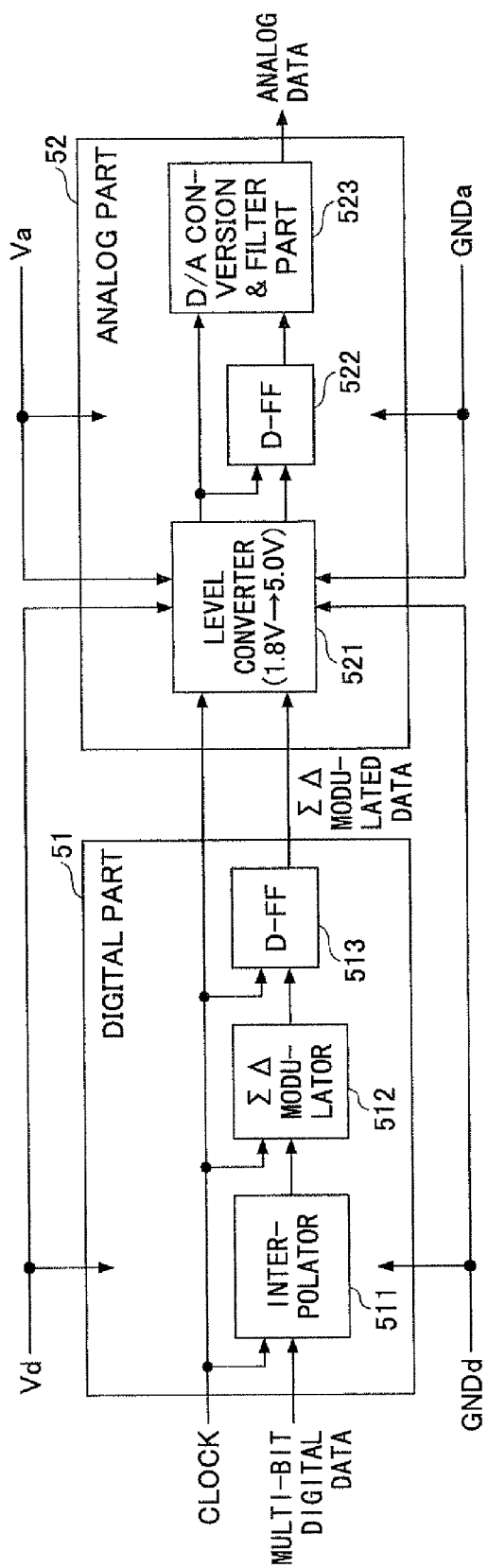
FIG. 6 is a diagram for explaining an example of the ΣΔ modulation D/A converter using the ΣΔ modulator.
Figure 7A:
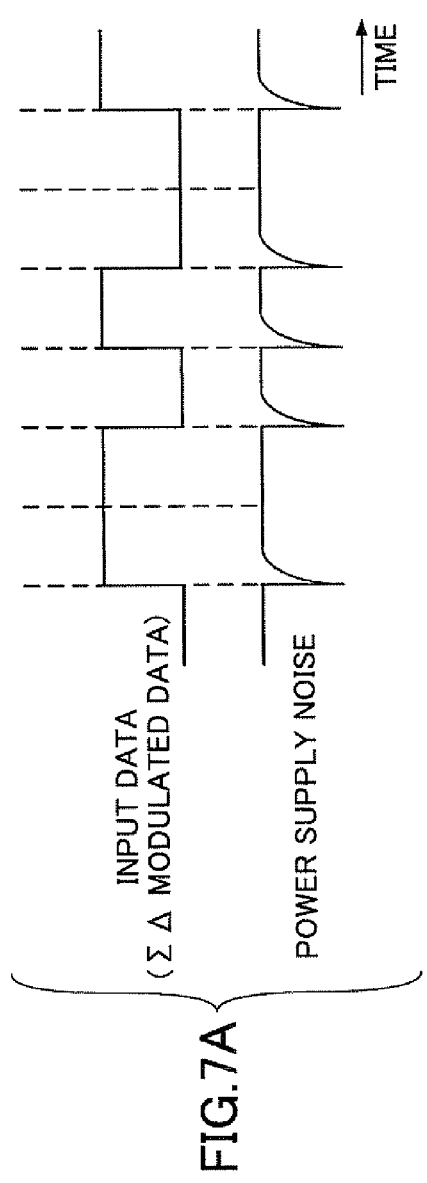
Figure 7B:
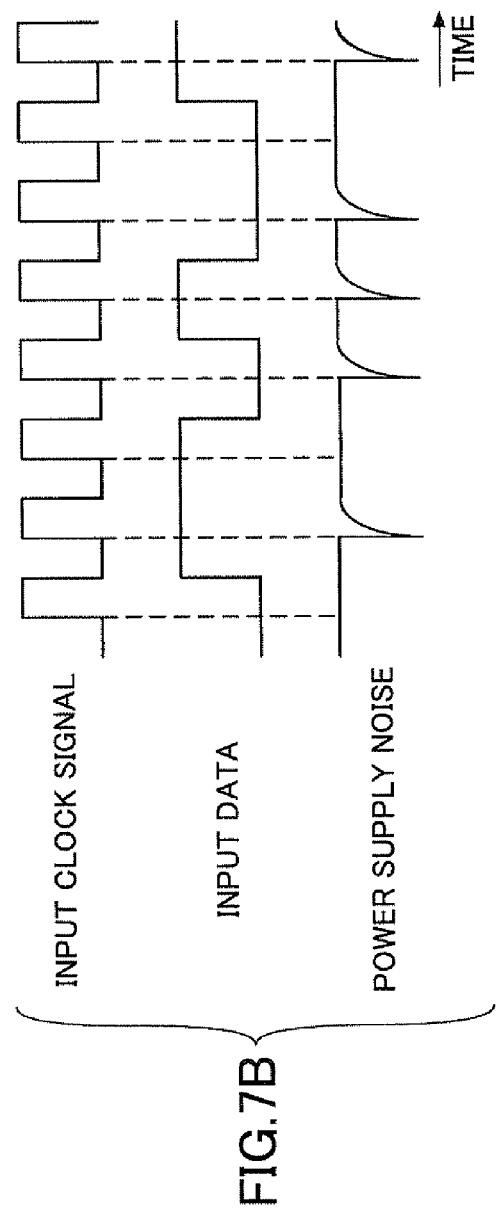
Figure 8:
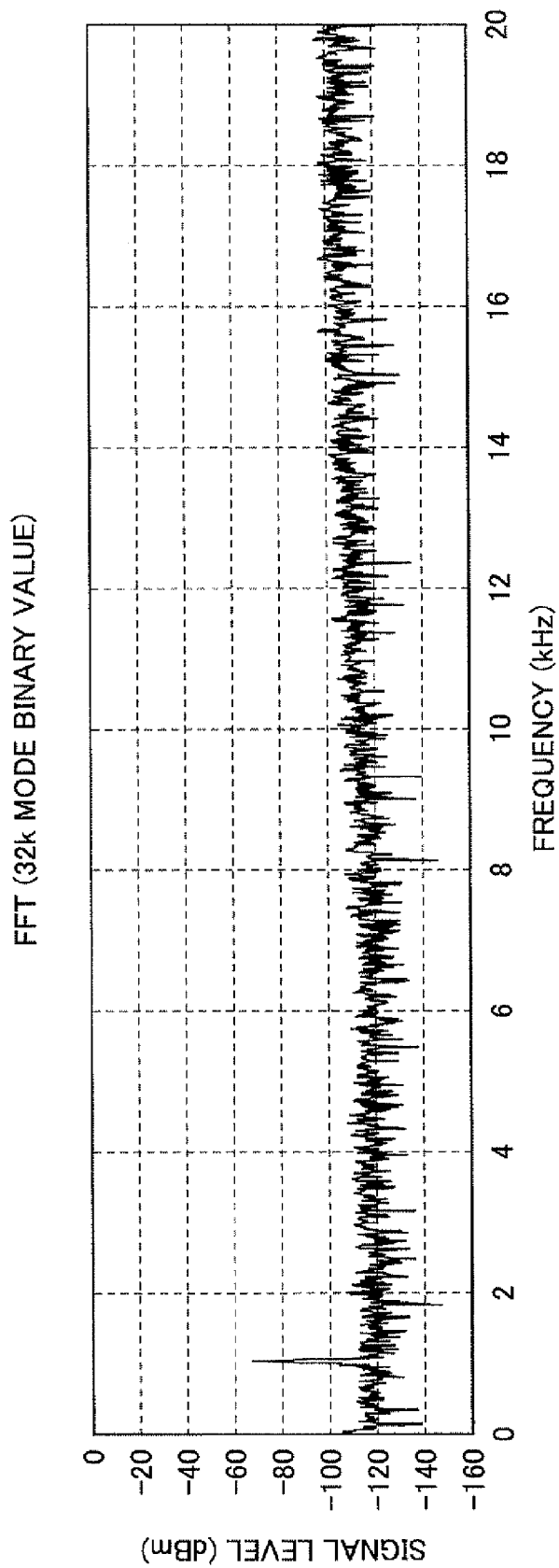
FIG. 8 is a diagram illustrating an example of a ΣΔ modulated data spectrum.
Figure 9:
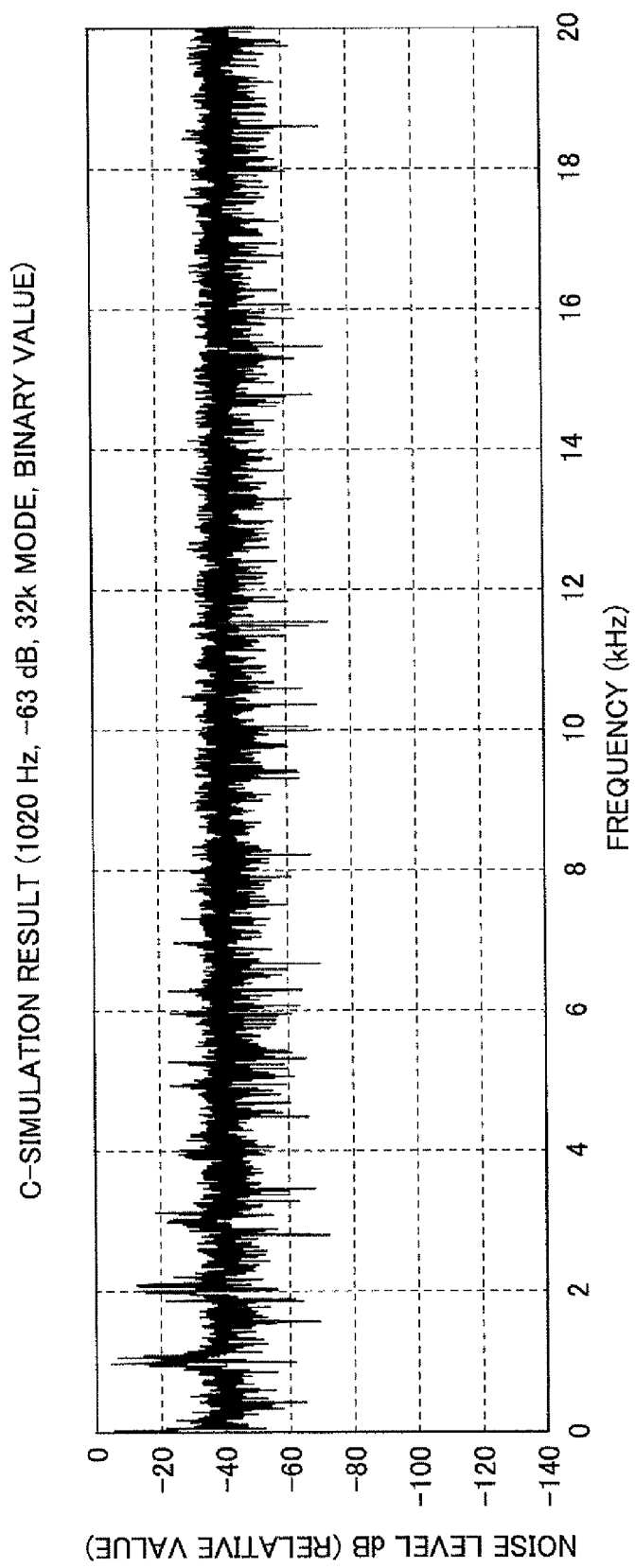
FIG. 9 is a diagram illustrating an example of a power supply noise spectrum.
Figure 10:
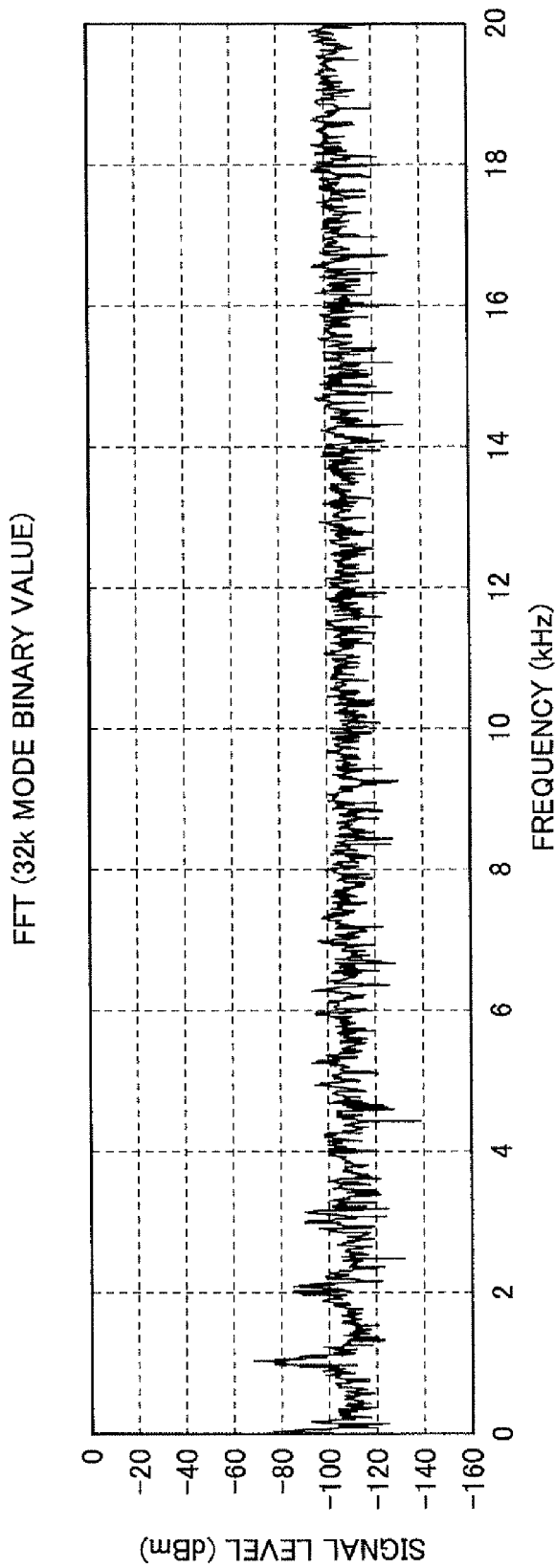
FIG. 10 is a diagram illustrating an example of an output signal spectrum affected by power supply noise.
Figure 12A:
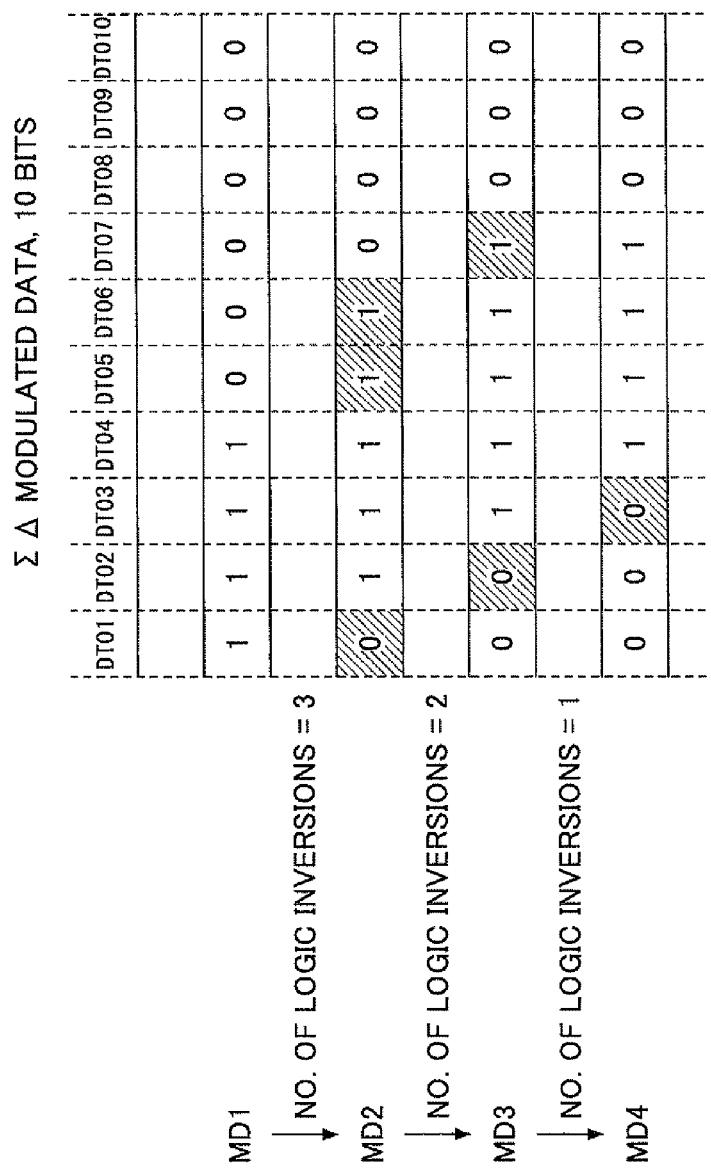
FIGS. 12A and 12B are diagrams for explaining an example of Dynamic Element Matching (DEM)
Figure 12B:
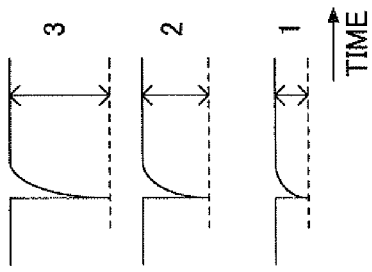
Figure 13:
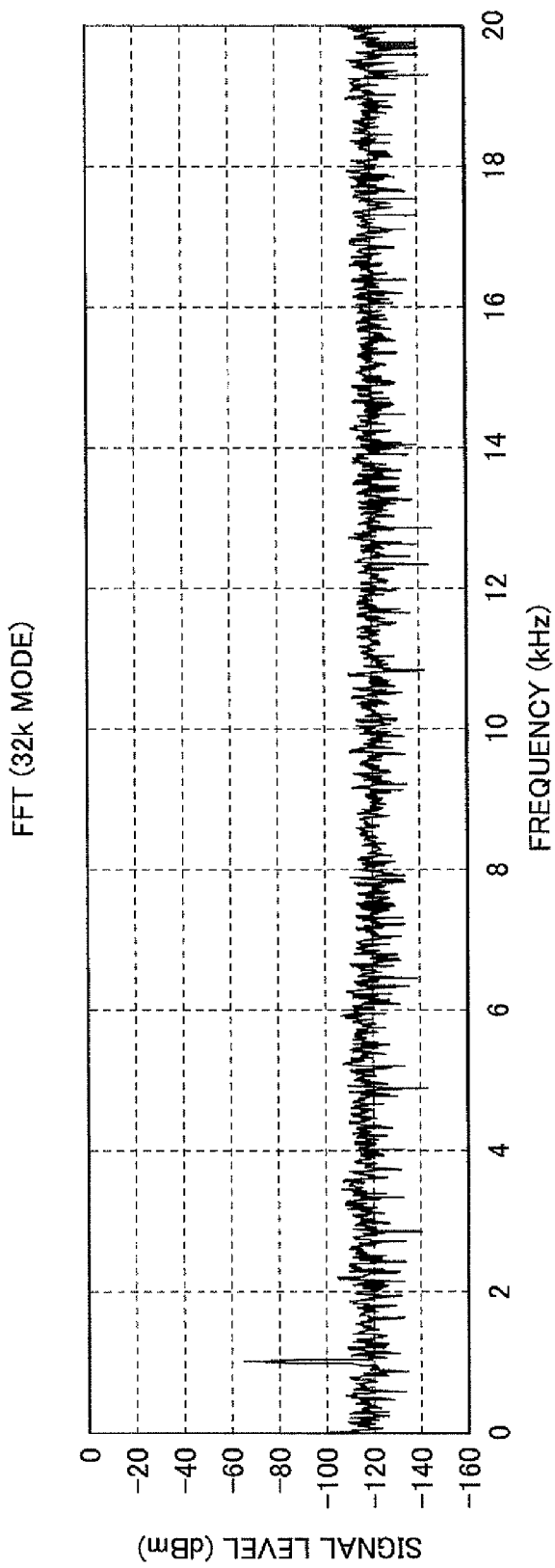
FIG. 13 is a diagram illustrating an example of a ΣΔ modulated data spectrum.
Figure 14:
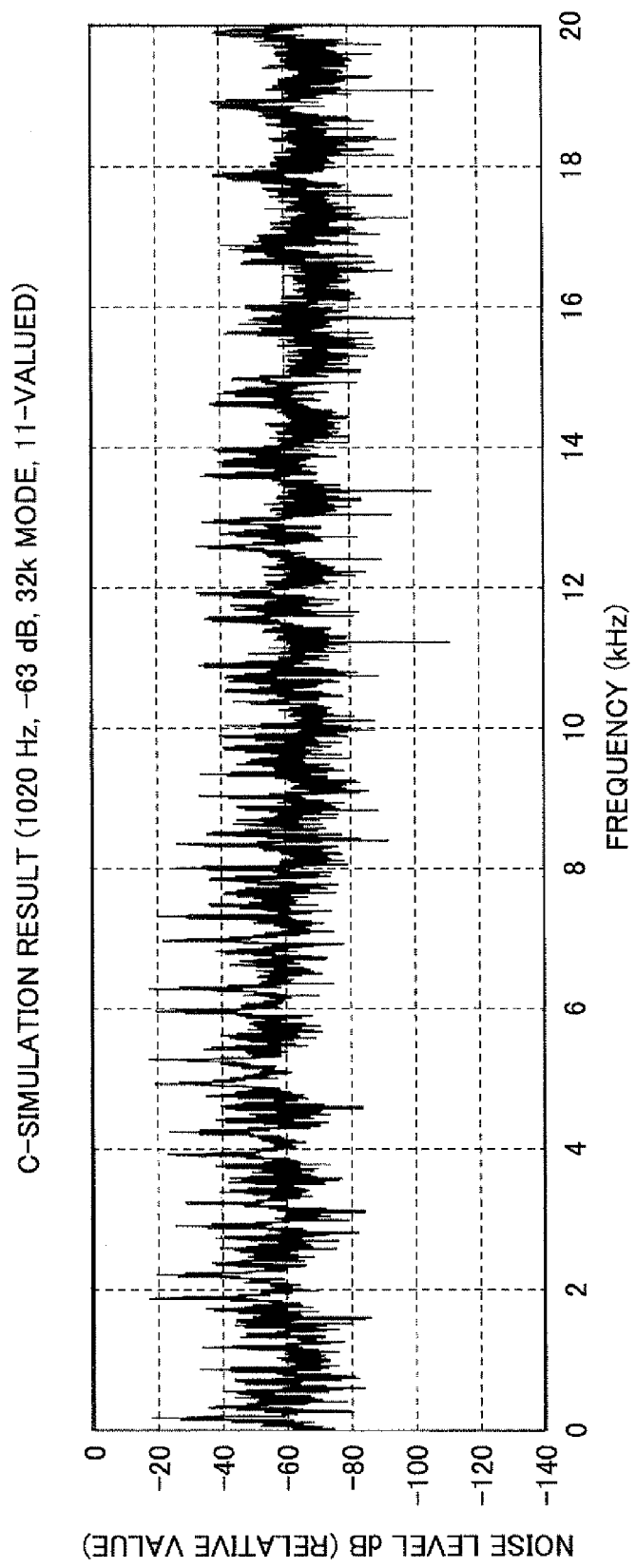
FIG. 14 is a diagram illustrating an example of a power supply noise spectrum.
Figure 15:
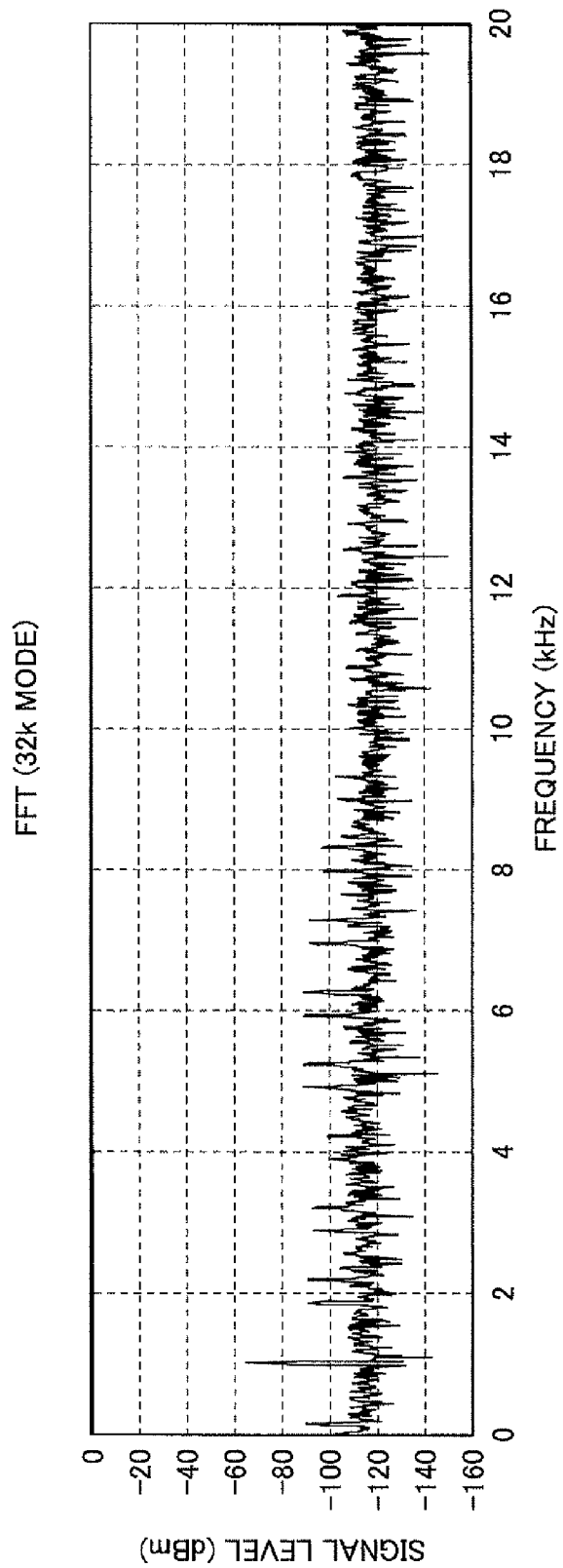
FIG. 15 is a diagram illustrating an example of an output signal spectrum affected by power supply noise.
Figure 17:
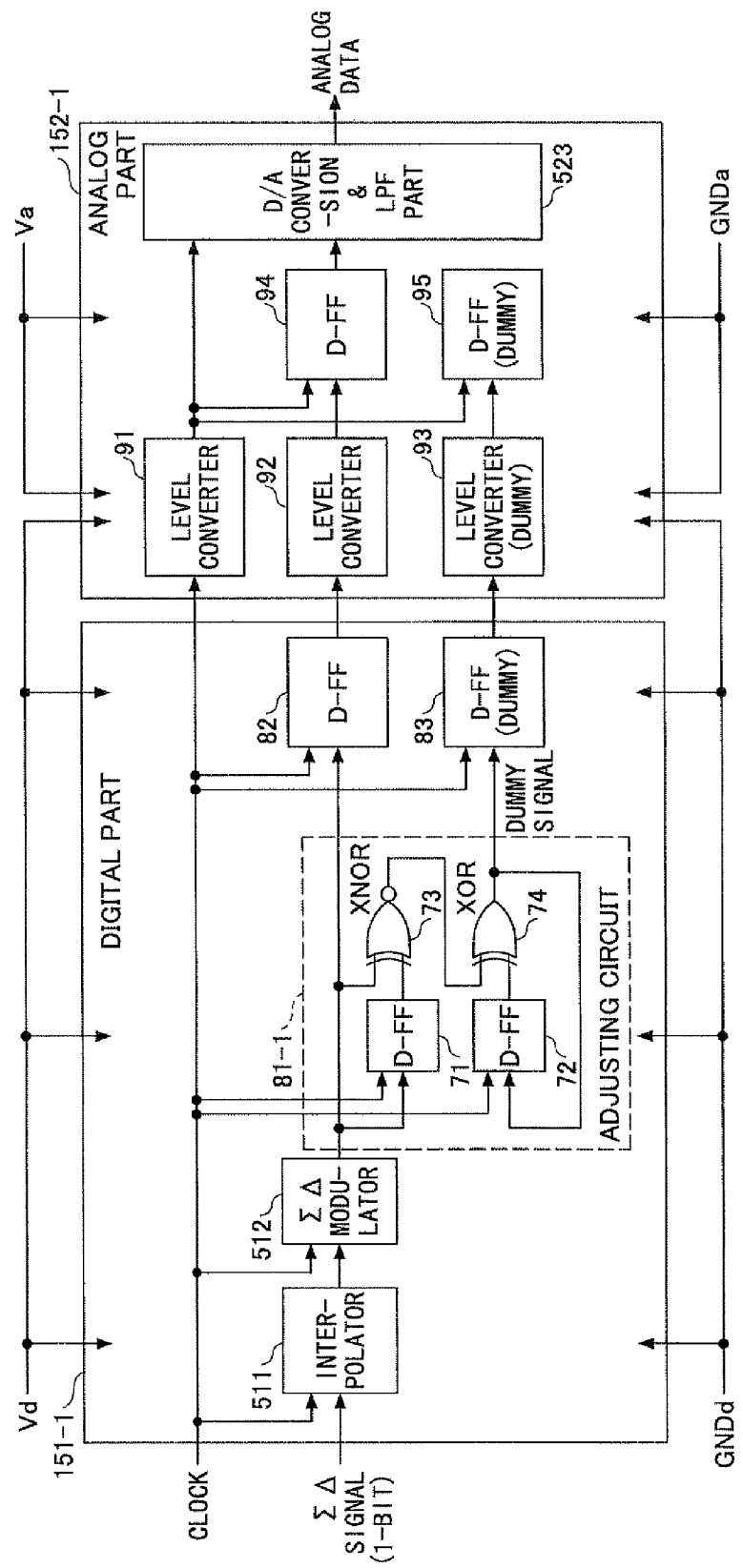
FIG. 17 is a diagram for explaining a D/A converter in the first embodiment of the present invention.

FIG. 17 is a diagram for explaining the D/A converter in the first embodiment of the present invention. In FIG. 17, those parts that are the same as those corresponding parts in FIG. 6 are designated by the same reference numerals, and a description thereof will be omitted.

FIG. 17 illustrates a ΣΔ modulation D/A converter using a ΣΔ modulator. The ΣΔ modulation D/A converter includes a digital part 151-1 and an analog part 152-1. The digital part 151-1 includes an interpolator 511, a ΣΔ modulator 512, an adjusting circuit 81-1 configured to maintain power supply noise constant, and Delay Flip-Flops (D-FFs) 82 and 83 that are connected as illustrated in FIG. 17. The D-FF 82 corresponds to the D-FF 513 illustrated in FIG. 6. The D-FF 83 forms a dummy D-FF provided with respect to the D-FF 82.

On the other hand, the analog part 152-1 includes level converters 91, 92 and 93, D-FFs 94 and 95, and a D/A conversion and lowpass filter part 523 that are connected as illustrated in FIG. 17. The level converters 91, 92 and 93 form a level converting part. The level converters 91 and 92 correspond to the two level converters within the level converting part 521 illustrated in FIG. 6. The level converter 93 forms a dummy level converter provided with respect to the level converter 92. The D-FF 94 corresponds to the D-FF 522 illustrated in FIG. 6. The D-FF 95 forms a dummy D-FF provided with respect to the D-FF 94. For example, a power supply voltage Vd=1.8 V is supplied to the digital part 151-1, and a power supply voltage Va=5.0 V is supplied to the analog part 152-1. GNDd denotes the ground for the digital part 151-1, and GNDa denotes the ground for the analog part 152-1.

The adjusting circuit 81-1 includes D-FFs 71 and 72, an exclusive-NOR (XNOR) circuit 73, and an exclusive-OR (XOR) circuit 74 that are connected as illustrated in FIG. 17. The XOR circuit 74 outputs the dummy data (or dummy signal), as will be described later. The XNOR circuit 73 obtains an exclusive-NOR between the present (or current) ΣΔ modulated data and the ΣΔ modulated data of one clock before in order to observe the amount of change of the ΣΔ modulated data from the ΣΔ modulator 512. The output data of the XNOR circuit 73 is supplied to one input of the XOR circuit 74. The output data of the XNOR circuit 73 has a data value "1" if two successive ΣΔ modulated data have the same data value "0" or "1" (that is, the data value does not change), and has a data value "0" if the two successive ΣΔ modulated data make a transition from "0" to "1" or from "1" to "0" (that is, the data value changes). The XOR circuit 74 obtains an exclusive-OR between the output data of the XNOR circuit 73 and the output dummy data of the XOR circuit 74 of one clock before. The present (or current) output dummy data of the XOR circuit 74 is supplied to the D-FF 83. Hence, the structure of the adjusting circuit 81-1 may be the same as the structure of the adjusting circuit 61-1 illustrated in FIG. 16.

An inverted value of the dummy data of one clock before becomes the present output data if the ΣΔ modulated data does not change (that is, makes no transition). On the other hand, the dummy data of one clock before becomes the present output data if the ΣΔ modulated data changes (that is, makes a transition). For this reason, the adjusting circuit 81-1 may carry out a control so that a sum of the amount of change of the ΣΔ modulated data and the amount of change of the dummy data becomes "1", in order to maintain the power supply noise constant. In addition, even in the case where the ΣΔ modulator outputs the multi-valued output having three or more values, the power supply noise may be maintained constant by providing the structure described above in multiple. In other words, the frequency dependence of the power supply noise with respect to the ΣΔ modulated data may be cancelled by providing the dummy digital elements, such as the D-FF and the level converter, which interpolate dummy power supply noise dependent on the input data frequency or the clock signal frequency.

In the circuits illustrated in FIGS. 16 and 17 in which the analog part and the digital part coexist, the ground GNDa for the analog part and the ground GNDd for the digital part may be provided separately for the purposes of reducing the noise or reducing the power consumption. In this case, a level converting part (or level converter) may be provided at an interface, and a delay circuit, such as a D-FF, is provided for clock signal synchronization. However, in the level converting part and the D-FF, a relatively large current may flow for an instant at a data transition point where the input data value makes a transition from "0" to "1" or makes a transition from "1" to "0", and the relatively large current may cause the power supply noise of the power supply or the ground. In other words, the power supply noise with respect to the analog part includes a frequency component different from that of the $\Sigma\Delta$ modulated data, but the power supply noise is dependent on the input data frequency or the clock signal frequency. In this embodiment, the dummy digital elements, such as the D-FF and the level converter, are provided to interpolate the dummy power supply noise that is dependent on the input data frequency or the clock signal frequency, in order to cancel the frequency dependence of the power supply noise with respect to the $\Sigma\Delta$ modulated data.

Figure 18B:
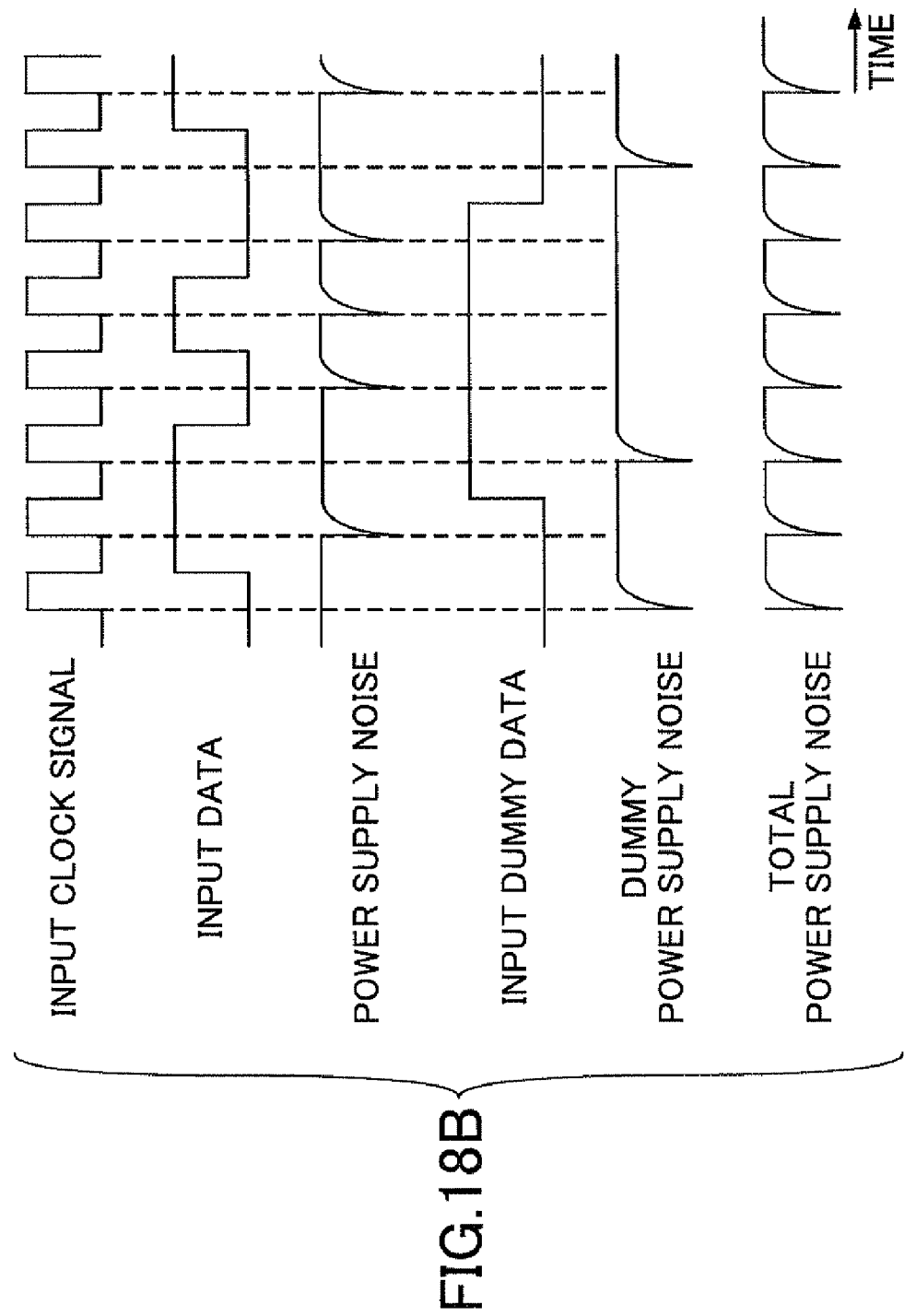

FIGS. 18A, 18B, and 18C are diagrams for explaining an example of the power supply noise generated at the data transition point. FIG. 18A illustrates the input data to the level converter (65 or 92) and the power supply noise with respect to the analog part (141-1 or 152-1), the input dummy data of the level converter (66 or 93) and the dummy power supply noise with respect to the analog part (141-1 or 152-1), and the total (or combined) power supply noise corresponding to the total (or combination) of the power supply noise with respect to the input data and the dummy power supply noise with respect to the input dummy data. FIG. 18B illustrates the input clock signal and the input data with respect to the D-FF (62 or 94) and the power supply noise with respect to analog part (141-1 or 152-1), the input dummy data to the D-FF (63 or 95) and the dummy power supply noise with respect to the analog part (141-1 or 152-1), and the total (or combined) power supply noise corresponding to the total (or combination) of the power supply noise with respect to the input data and the dummy power supply noise with respect to the input dummy data. In FIGS. 18A and 18B, the ordinate indicates the signal level in arbitrary units, and the abscissa indicates the time in arbitrary units. In addition, FIG. 18C illustrates the $\Sigma\Delta$ modulated data output from the $\Sigma\Delta$ modulator (411 or 512), the relative value of the amount of power supply noise with respect to the analog part (141-1 or 152-1), the dummy data, the amount of dummy power supply noise, and the total amount of power supply noise corresponding to the total (or combination) of the amount of power supply noise and the amount of dummy power supply noise. It was also confirmed from FIGS. 18A through 18C that the frequency dependence of the power supply noise with respect to the $\Sigma\Delta$ modulated data may be cancelled by interpolating the dummy power supply noise dependent on the input data frequency of the clock signal frequency.

Second Embodiment

Figure 19:
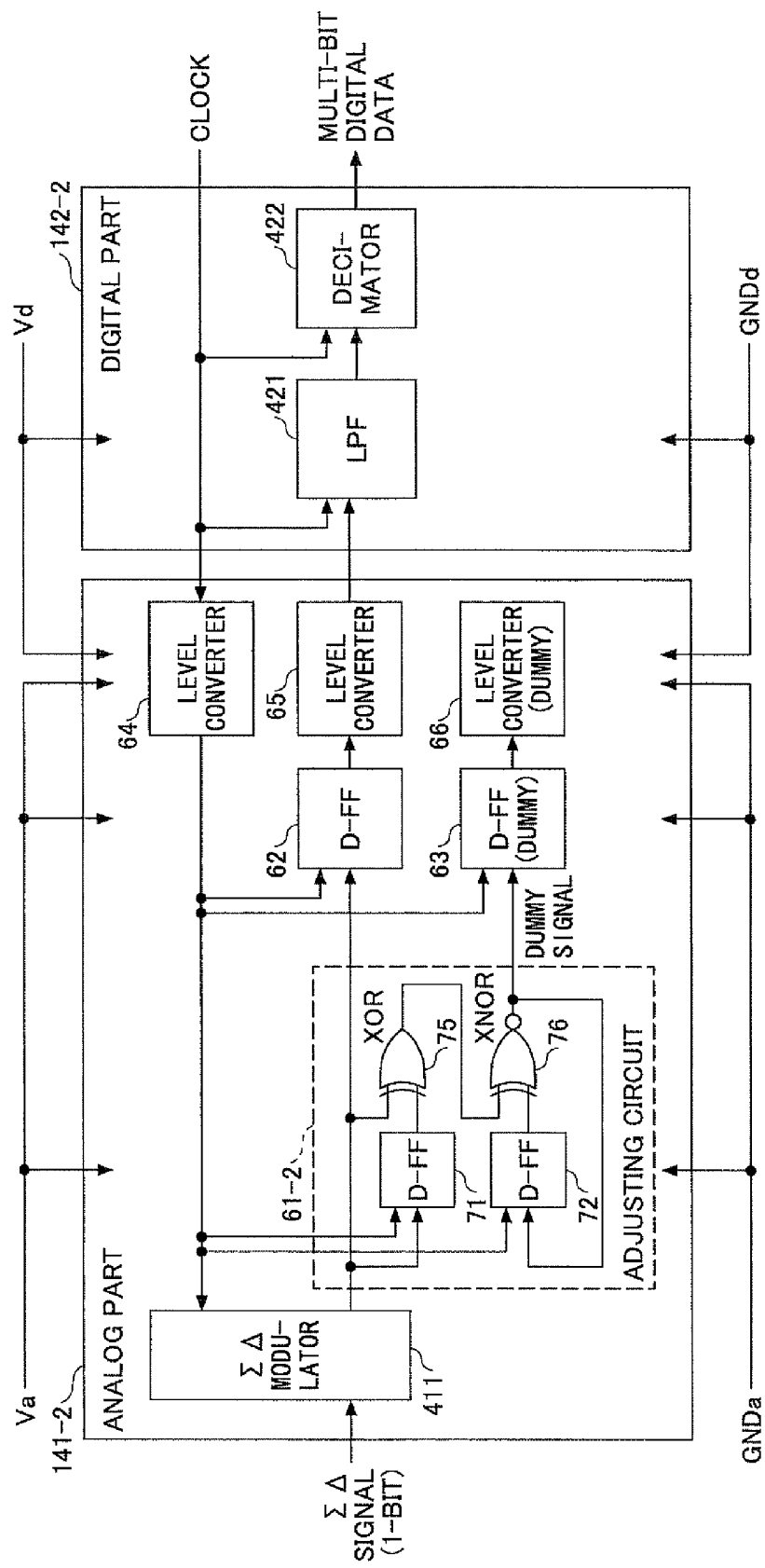
FIG. 19 is a diagram for explaining an A/D converter in a second embodiment of the present invention.

FIG. 19 is a diagram for explaining the A/D converter in a second embodiment of the present invention. In FIG. 19, those parts that are the same as those corresponding parts in FIG. 16 are designated by the same reference numerals, and a description thereof will be omitted.

An adjusting circuit 61-2 includes D-FFs 71 and 72, an exclusive-OR (XOR) circuit 75, and an exclusive-NOR (XNOR) circuit 76 that are connected as illustrated in FIG. 19. The XNOR circuit 76 outputs the dummy data (or dummy signal), as will be described later. The XOR circuit 75 obtains an exclusive-OR between the present (or current) $\Sigma\Delta$ modulated data and the $\Sigma\Delta$ modulated data of one clock before in order to observe the amount of change of the $\Sigma\Delta$ modulated data from the $\Sigma\Delta$ modulator 411. The output data of the XOR circuit 75 is supplied to one input of the XNOR circuit 76. The output data of the XOR circuit 75 has a data value "0" if two successive $\Sigma\Delta$ modulated data have the same data value "0" or "1" (that is, the data value does not change), and has a data value "1" if the two successive $\Sigma\Delta$ modulated data make a transition from "0" to "1" or from "1" to "0" (that is, the data value changes). The XNOR circuit 76 obtains an exclusive-NOR between the output data of the XOR circuit 75 and the output dummy data of the XNOR circuit 76 of one clock before. The present (or current) output dummy data of the XNOR circuit 76 is supplied to the D-FF 63.

An inverted value of the dummy data of one clock before becomes the present output data if the $\Sigma\Delta$ modulated data does not change (that is, makes no transition). On the other hand, the dummy data of one clock before becomes the present output data if the $\Sigma\Delta$ modulated data changes (that is, makes a transition). For this reason, the adjusting circuit 61-2 may carry out a control so that a sum of the amount of change of the $\Sigma\Delta$ modulated data and the amount of change of the dummy data becomes "1", in order to maintain the power supply noise constant. In addition, even in the case where the $\Sigma\Delta$ modulator outputs the multi-valued output having three or more values, the power supply noise may be maintained constant by providing the structure described above in multiple. In other words, the frequency dependence of the power supply noise with respect to the $\Sigma\Delta$ modulated data may be cancelled by providing the dummy digital elements, such as the D-FF and the level converter, which interpolate dummy power supply noise dependent on the input data frequency or the clock signal frequency.

Figure 20:
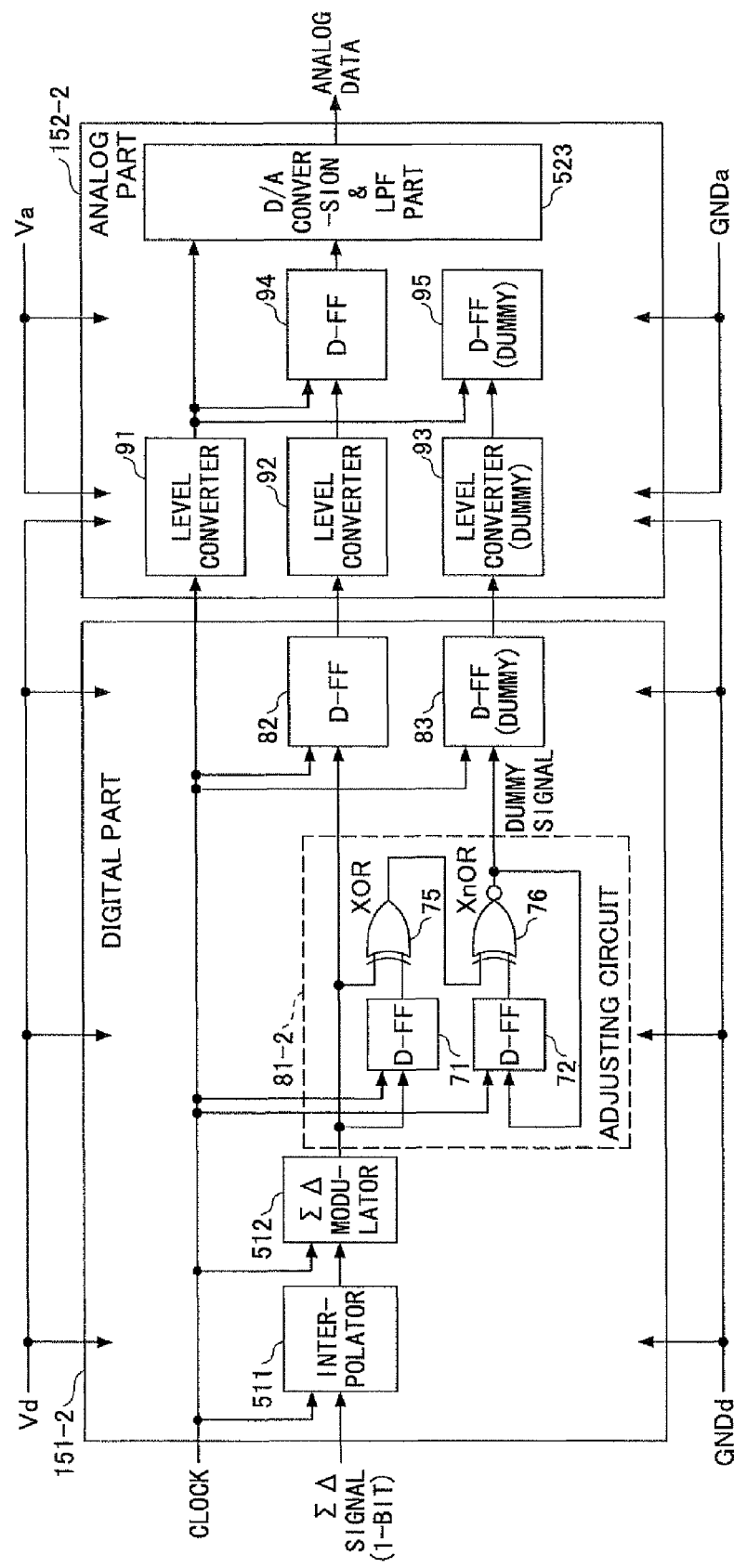
FIG. 20 is a diagram for explaining a D/A converter in the second embodiment of the present invention.

FIG. 20 is a diagram for explaining the D/A converter in the second embodiment of the present invention. In FIG. 20, those parts that are the same as those corresponding parts in FIG. 17 are designated by the same reference numerals, and a description thereof will be omitted.

An adjusting circuit 81-2 includes D-FFs 71 and 72, an exclusive-OR (XOR) circuit 75, and an exclusive-NOR (XNOR) circuit 76 that are connected as illustrated in FIG. 20. The XNOR circuit 76 outputs the dummy data (or dummy signal), as will be described later. The XOR circuit 75 obtains an exclusive-OR between the present (or current) $\Sigma\Delta$ modulated data and the $\Sigma\Delta$ modulated data of one clock before in order to observe the amount of change of the $\Sigma\Delta$ modulated data from the $\Sigma\Delta$ modulator 512. The output data of the XOR circuit 75 is supplied to one input of the XNOR circuit 76. The output data of the XOR circuit 75 has a data value "0" if two successive $\Sigma\Delta$ modulated data have the same data value "0" or "1" (that is, the data value does not change), and has a data value "1" if the two successive $\Sigma\Delta$ modulated data make a transition from "0" to "1" or from "1" to "0" (that is, the data value changes). The XNOR circuit 76 obtains an exclusive-NOR between the output data of the XOR circuit 75 and the output dummy data of the XNOR circuit 76 of one clock before. The present (or current) output dummy data of the XNOR circuit 76 is supplied to the D-FF 83. Hence, the structure of the adjusting circuit 81-2 may be the same as the structure of the adjusting circuit 61-2 illustrated in FIG. 19.

An inverted value of the dummy data of one clock before becomes the present output data if the ΣΔ modulated data does not change (that is, makes no transition). On the other hand, the dummy data of one clock before becomes the present output data if the ΣΔ modulated data changes (that is, makes a transition). For this reason, the adjusting circuit 81-2 may carry out a control so that a sum of the amount of change of the ΣΔ modulated data and the amount of change of the dummy data becomes "1", in order to maintain the power supply noise constant. In addition, even in the case where the ΣΔ modulator outputs the multi-valued output having three or more values, the power supply noise may be maintained constant by providing the structure described above in multiple. In other words, the frequency dependence of the power supply noise with respect to the ΣΔ modulated data may be cancelled by providing the dummy digital elements, such as the D-FF and the level converter, which interpolate dummy power supply noise dependent on the input data frequency or the clock signal frequency.

In the circuits illustrated in FIGS. 19 and 20 in which the analog part and the digital part coexist, the ground GNDa for the analog part and the ground GNDd for the digital part may be provided separately for the purposes of reducing the noise or reducing the power consumption. In this case, a level converting part (or level converter) may be provided at an interface, and a delay circuit, such as a D-FF, is provided for clock signal synchronization. However, in the level converting part and the D-FF, a relatively large current may flow for an instant at a data transition point where the input data value makes a transition from "0" to "1" or makes a transition from "1" to "0", and the relatively large current may cause the power supply noise of the power supply or the ground. In other words, the power supply noise with respect to the analog part includes a frequency component different from that of the ΣΔ modulated data, but the power supply noise is dependent on the input data frequency or the clock signal frequency. In this embodiment, the dummy digital elements, such as the D-FF and the level converter, are provided to interpolate the dummy power supply noise that is dependent on the input data frequency or the clock signal frequency, in order to cancel the frequency dependence of the power supply noise with respect to the ΣΔ modulated data.

(Modification)

The amount of power supply noise may also differ depending on a physical distance and the like of the element from the power supply or the ground. For this reason, it may be desirable in each of the embodiments described above to arrange the dummy digital elements, such as the dummy D-FF and the dummy level converter, adjacent to (or close to) the digital elements, such as the D-FF and the level converter, that are provided within the analog part or the digital part. In addition, in the case where the multi-valued ΣΔ modulated data has three or more values, it may be desirable to employ a layout in which the digital element and the corresponding dummy digital element are alternately arranged. In this case, it may be desirable for each digital element and the corresponding dummy digital element to use the same power supply or the same ground, and it may be desirable to maintain the wiring distances of the digital element and the corresponding digital element from the power supply or the ground to be the same.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An analog-to-digital converter comprising:

a ΣΔ modulator;

an adjusting circuit, coupled to the ΣΔ modulator, and configured to output dummy data and adjust a total of an amount of change of ΣΔ modulated data output from the ΣΔ modulator and an amount of change of the dummy data to be constant; and a level converting part, coupled to the ΣΔ modulator, and configured to receive the ΣΔ modulated data, wherein the adjusting circuit outputs an inverted value of the dummy data of one clock before as present output data when the ΣΔ modulated data does not change, and outputs the dummy data of one clock before as the present output data when the ΣΔ modulated data changes, wherein the level converting part includes a first level converter configured to output the ΣΔ modulated data by converting a level of the ΣΔ modulated data, and a second level converter configured to receive the dummy data from the adjusting circuit, and wherein the second level converter is configured to cancel a frequency dependence of noise with respect to the ΣΔ modulated data.

2. The analog-to-digital converter as claimed in claim 1, wherein the first level converter and the second level converter receive a common power supply voltage.

3. The analog-to-digital converter as claimed in claim 1, further comprising:

a first delay circuit coupled between the ΣΔ modulator and the first level converter; and a second delay circuit coupled between the adjusting circuit and the second level converter, wherein the first delay circuit and the second delay circuit receive a common clock signal, and the second level converter and the second delay circuit are configured to cancel the frequency dependence of the noise with respect to the ΣΔ modulated data.

4. The analog-to-digital converter as claimed in claim 1, further comprising:

a digital lowpass filter configured to receive data output from the first level converter, and to eliminate quantization noise shifted in a high-frequency range by the ΣΔ modulator.

5. The analog-to-digital converter as claimed in claim 4, further comprising:

a decimator configured to decimate output data of the digital lowpass filter, eliminated of the quantization noise, to have a predetermined sampling rate.

6. A digital-to-analog converter comprising:

a ΣΔ modulator;

an adjusting circuit, coupled to the ΣΔ modulator, and configured to output dummy data and adjust a total of an amount of change of ΣΔ modulated data output from the ΣΔ modulator and an amount of change of the dummy data to be constant; and a level converting part, coupled to the ΣΔ modulator, and configured to receive the ΣΔ modulated data, wherein the adjusting circuit outputs an inverted value of the dummy data of one clock before as present output data when the ΣΔ modulated data does not change, and outputs the dummy data of one clock before as the present output data when the ΣΔ modulated data changes, wherein the level converting part includes a first level converter configured to output the ΣΔ modulated data by converting a level of the ΣΔ modulated data, and a second level converter configured to receive the dummy data from the adjusting circuit, and wherein the second level converter is configured to cancel a frequency dependence of noise with respect to the ΣΔ modulated data.

7. The digital-to-analog converter as claimed in claim 6, further comprising:

a delay circuit coupled between the first level converter and the digital-to-analog conversion and lowpass filter part.

8. The digital-to-analog converter as claimed in claim 6, further comprising:

a digital-to-analog conversion and lowpass filter part configured to receive data output from the first level converter.

9. The digital-to-analog converter as claimed in claim 6, further comprising:

a first delay circuit coupled between the ΣΔ modulator and the first level converter; and a second delay circuit coupled between the adjusting circuit and the second level converter, wherein the first delay circuit and the second delay circuit receive a common clock signal, and the second level converter and the second delay circuit are configured to cancel the frequency dependence of the noise with respect to the ΣΔ modulated data.

10. The digital-to-analog converter as claimed in claim 6, wherein the first level converter and the second level converter receive a common power supply voltage.

11. The digital-to-analog converter as claimed in claim 6, further comprising:

an interpolator configured to interpolate the input digital data before supplying the same to the ΣΔ modulator, so that the ΣΔ modulator carries out an oversampling.

* * * * *